United States Patent [19]

Butler

[11] Patent Number: 4,864,548

[45] **Date of Patent: * Sep. 5, 1989**

[54] FLEXTENSIONAL TRANSDUCER

[75] Inventor: John L. Butler, Marshfield, Mass.

[73] Assignee: Image Acoustics, Inc., North Marshfield, Mass.

[ * ] Notice: The portion of the term of this patent subsequent to May 3, 2005 has been disclaimed.

[21] Appl. No.: 186,300

[22] Filed: Apr. 26, 1988

Related U.S. Application Data

[63] Continuation-in-part of Ser. No. 873,961, Jun. 13, 1986, Pat. No. 4,742,499.

[51] Int. Cl.[4] ...................... H01L 41/04; H01L 41/06; H04R 15/00; H04K 17/00

[52] U.S. Cl. .................................... 367/155; 367/156; 367/165; 367/168; 310/26; 310/337

[58] Field of Search ................. 310/26, 322, 333, 334, 310/337; 367/155–159, 164, 165, 168, 174, 175; 381/190, 205; 318/118; 73/DIG. 2

[56] References Cited

U.S. PATENT DOCUMENTS

| | | | |
|---|---|---|---|
| 2,064,911 | 12/1936 | Hayes | 367/168 |
| 3,160,769 | 12/1964 | Abbott | 367/168 |
| 3,258,738 | 6/1966 | Merchant | 367/157 |
| 3,277,433 | 10/1966 | Toulis | 367/157 |
| 4,072,871 | 2/1978 | Wilson | 310/333 |
| 4,384,351 | 5/1983 | Pagliarini, Jr. et al. | 367/175 |
| 4,432,080 | 2/1984 | Wardle | 367/163 |
| 4,443,731 | 4/1984 | Butler et al. | 310/334 |
| 4,742,499 | 5/1988 | Butler | 367/155 |
| 4,754,441 | 6/1988 | Butler | 367/157 |

*Primary Examiner*—Brian S. Steinberger
*Attorney, Agent, or Firm*—Wolf, Greenfield & Sacks

[57] ABSTRACT

An acoustic transducer for providing large displacements particularly at low acoustic frequencies is formed from a minimum of three curved shells which are attached to each other at their ends. The shells are driven by a ring or corresponding number of attached piezoelectric or magnetostrictive type rod or bar drivers. The curved shells are attached to the ends of the driver and vibrate with a magnified motion as the rods execute extensional motion. As the polygon expands the curved shells deform and produce additional motion in the same radial direction resulting in a large total displacement and corresponding large acoustic output.

33 Claims, 9 Drawing Sheets

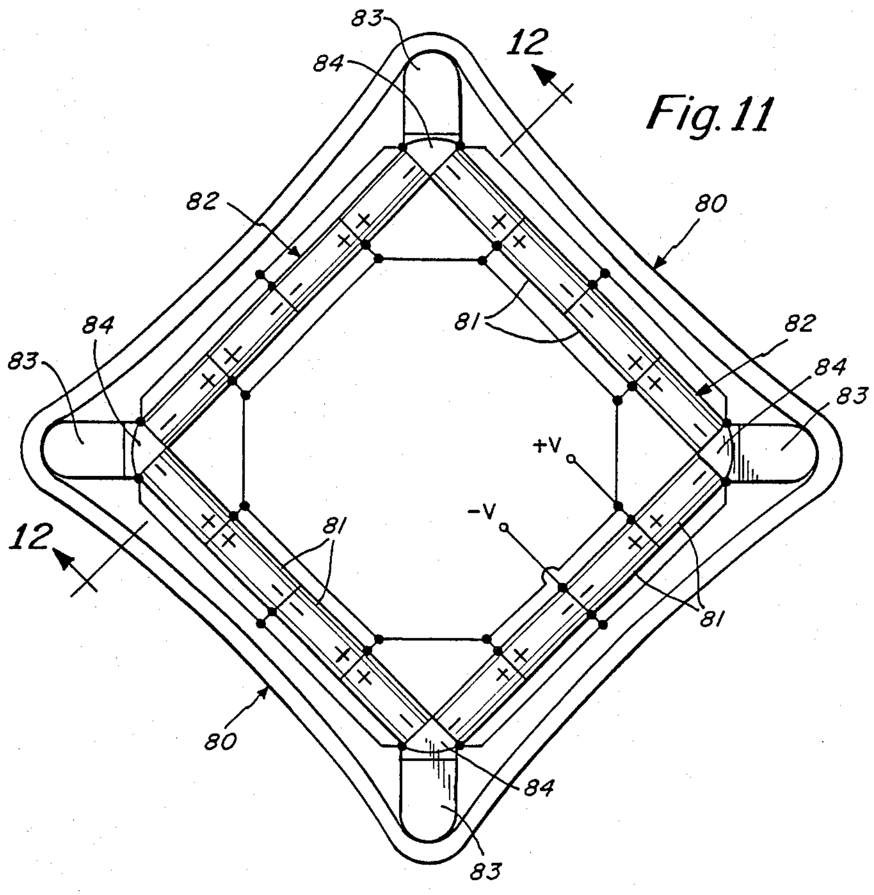
Fig. 11
Fig. 12
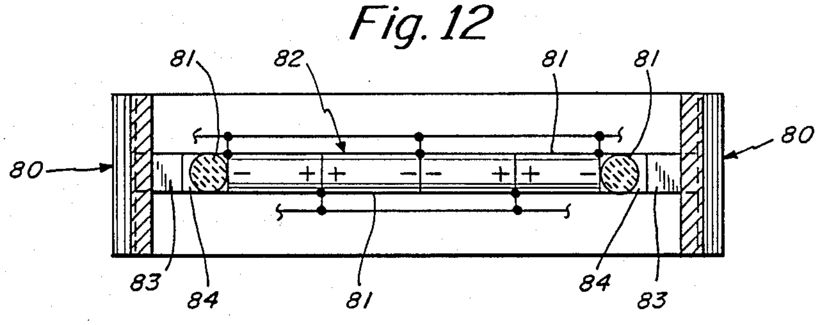

FLEXTENSIONAL TRANSDUCER

RELATED APPLICATION

This application is a continuation-in-part of application Ser. No. 06/873,961 filed June 13, 1986, now U.S. Pat. No. 4,742,499.

BACKGROUND OF THE INVENTION

1. Field of the Invention

The present invention relates in general to an acoustic transducer and pertains, more particularly, to a flextensional polygon transducer which, inter alia, provides large displacements at low acoustic frequencies.

2. Background Discussion

A number of so-called flextensional transducer designs have evolved based on the patents of W. J. Toulis, U.S. Pat. No. 3,277,433, "Flexural-Extensional Electromechanical Transducer", Oct. 4, 1966 and H. C. Merchant, U.S. Pat. No. 3,258,738, "Underwater Transducer Apparatus", June 28, 1966. In the invention of Toulis an oval-shaped cylindrical shell is driven along its major axis by a stack of piezoelectric bars resulting in a magnified motion of the shell in the minor axis as driven by the piezoelectric stack. The motions are opposite in phase the major to minor axis if the shell is in the shape of an ellipse. In the H. C. Merchant invention the shell is curved inward in a concave way so that the motion along the major axis and the ends is in phase with the motion in the direction of the minor axis.

These prior art patents are limited to a transduction in which four orthogonal surfaces are in motion. In one case all four move in phase while in the other case the orthogonal motions are out of phase. In neither case are the directions of major motion in the same direction as the motion of the transduction mechanism. In both of these prior patents the direction of the magnified motion is in a direction which is orthoqonal to the driver direction. Moreover, only two major surfaces produce the large motion which may result in directional acoustic radiation at frequencies higher than the fundamental shell system resonance. Also, since the driver mechanism is very stiff compared to the shell the resonance of the driver is much higher than that of the shell making it difficult to design the system with a coupled resonance. In the case of the above two patents the driver stack is operated as a stiff spring attached to the two ends of the shell along the major axis. On the other hand the invention disclosed herein overcomes these limitations and adds a new degree of motion which is in the same general direction as the shell motion.

OBJECT OF THE INVENTION

Accordingly, it is an object of the present invention to provide an improved flextensional transducer that is characterized by improved shell motion for a given drive.

Another object of the present invention is to provide an improved flextensional transducer including a piezoelectric or magnetostrictive drive mechanism in which motion is magnified by a flextensional induced bending motion which is in the same general direction of the major motion of the transduction driver thus resulting in an additive motion.

A further object of the present invention is to provide an improve flextensional transducer in which the transducer shell may be in a form circumscribed by a triangle or higher order regular polygon such as an octagon or a simple square.

Still another object of the present invention is to provide an improved flextensional transducer that is of fluid-tight construction particularly for use in a fluid environment such as is connection with underwater acoustic measurement.

Still a further object of the present invention is to provide an improved flextensional transducer and one which is particularly characterized by the use of a piezoelectric drive mechanism for use, in particular, in underwater applications.

SUMMARY OF THE INVENTION

To accomplish the foregoing and other objects, features and advantages of the invention there is provided an acoustic transducer and more particularly a flextensional polygon transducer which is adapted to provide large displacements at low acoustic frequencies. The transducer of the invention comprises a minimum of three curved shells which are attached to each other at their ends. The shells are driven by a ring or corresponding number of attached piezoelectric or magnetostrictive type rod or bar drivers which together take on the form of a regular polygon. The curved shells are attached to the ends of the drivers and vibrate with a magnified motion as the rods execute extensional motion. As the polygon expands the curved shells deform and produce additional motion in the same radial direction resulting in a large total displacement and corresponding large acoustic output. The resonance of the polygon or ring transducer and the curved shells may be adjusted for broad band operation and extended low frequency performance. Because of the near ring or cylindrical shape of the shell structure, the beam pattern is nearly omnidirectional in the plane of the ring. In connection with one piezoelectric drive embodiment of the invention, the transducer is formed as a fluid tight structure.

BRIEF DESCRIPTION OF THE DRAWINGS

Numerous other objects, features and advantages of the invention should now become apparent upon a reading of the following detailed description taken in conjunction with the accompanying drawings, in which:

FIG. 11 illustrates a four-sided asteroid shell with an interior piezoelectric bar drive arrangement;

FIG. 12 is a cross sectional view taken along 12—12 of FIG. 11;

FIG. 19 is a fragmentary cross-sectional view of an alternate embodiment of the invention implying standoffs or the like.

DETAILED DESCRIPTION

The present invention relates to a transduction device in which either piezoelectric or magnetostrictive mechanisms provide motion that is magnified by a flextensional (flexural-extensional) induced bending motion which is also in the same general direction of the major motion of the transduction driver thus resulting in an additive motion. The shell may be in a form circumscribed by a triangle or higher order regular polygon such as an octagon or a simple square.

Figure 1:
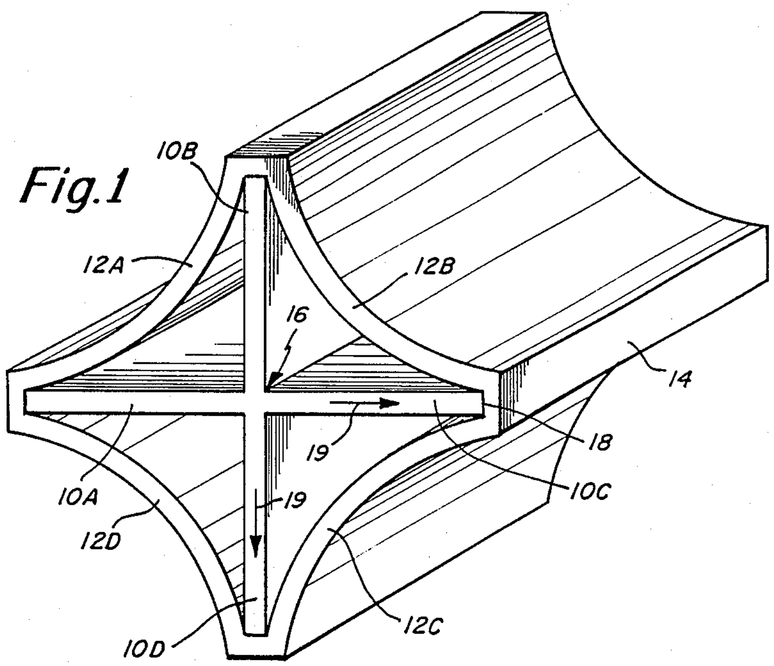
FIG. 1 is a perspective view showing the principals of the present invention as applied to a four sided astroid-shaped transducer employing piezoelectric bars inside of four curved shells interconnected at their ends.

An example of a four sided astroid shaped device is illustrated in FIG. 1. FIG. 1 illustrates a set of crossed piezoelectric ceramic bars 10A–10D driving the shells 12A–12D. Each of the shells may be made of light weight metal such as aluminum. Each of the respective shells are connected at their ends to an adjacent shell such as at the wall 14 in FIG. 1. Each of the ceramic bars extend from the center of the transducer at 16 to each of the apexes of the joined shells. In this regard note in FIG. 1 the outer end 18 of the ceramic bar 10C coupled to the apex of the shells 12B and 12C at the wall 14.

The ceramic bars 10A–10D may be operated in either the 31 or 33 mode. In the latter case a number of ceramic plates are used to comprise each bar and these plates are wired in parallel. The ceramic bars oscillate under application of an alternating voltage applied to the ceramic plates and cause the shell to move with the same frequency of oscillation. The 33 mode piezoelectric operation provides the greatest coupling coefficient and is the preferred mode of operation herein.

In the embodiment of FIG. 1, as the bars 10A–10D expand outwardly such as in the direction of the arrow 19, the ends of the curved part of the shells 12A–12D also move outward in the same direction as the drivers causing the curved part to bend outward with a magnified motion. The total outward motion is the resultant sum which is greater than either motion alone. In some applications the two ends of the transducer may be covered by a mechanically isolated and decoupled plate to prevent the inner out-of-phase radiation from interfering with the radiation from the outer part of the shell, and to prevent the piezoelectric ceramic from shorting out particularly for the case of a water loading medium flooding the inside of the transducer. In this case the inner part could be filled with a compliant oil or gas such as air.

Figure 2:
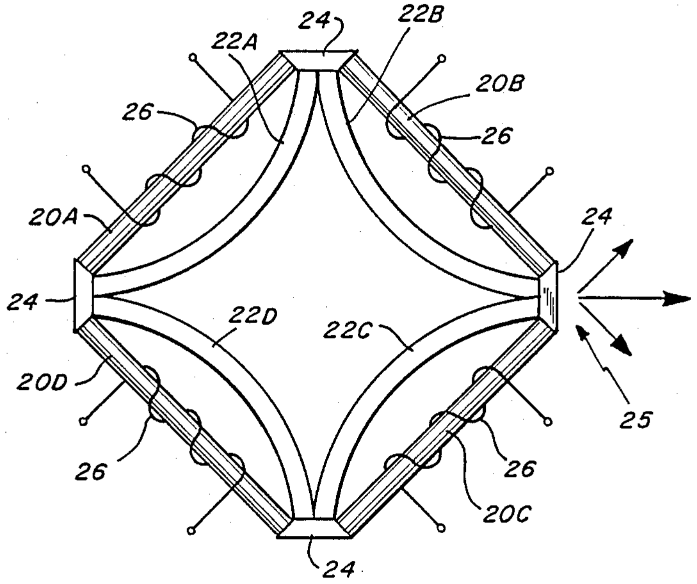
FIG. 2 schematically illustrates alternative embodiment of the present invention employing magnetostrictive rods or bars for driving the apexes of the shell from the outside and energized through coils surrounding these magnetostrictive rods or bars.

Reference is now made to FIG. 2 which schematically illustrates an alternate drive configuration. In FIG. 2 there is provided magnetostrictive rods 20A–20D for driving the associated shells 22A–22D. The shells 22A–22D may be of a light weight metal such as aluminum. In place of the magnetostrictive rods one may employ magnetostrictive bars, plates or some type of lamination of magnetostrictive or piezoelectric elements.

In FIG. 2 it is noted that there is provided at the corners of the transducers securing means illustrated at 24. This securing means ties the apexes of the shells together and likewise joins adjacent ends of the magnetostrictive rods. The magnetostrictive rods drive the apexes of the shells from the outside. Each of the magnetostrictive rods are energized through an energizing coil 26. Each coil surrounds the corresponding magnetostrictive rod as illustrated in FIG. 2.

The embodiment of FIG. 2 is a practical arrangement for underwater sound applications because the coils and connections may be easily made watertight and also because the required voltages for magnetostrictive devices are generally low because of their low impedance. In this configuration an additional benefit results from the cooling properties of the surrounding fluid allowing greater sustained power operation for the magnetostrictive rods.

The magnetostrictive composition may be the more conventional nickel or the new rare earth composition $Tb_{0.3}Dy_{0.7}Fe_2$ (Terfenol) or the metallic glass composition $Fe_{81}B_{13.5}Si_{3.5}C_{2.0}$ which have greater coupling coefficients than the piezoelectric ceramics and in the case of Terfenol have significantly greater output potential. Piezoelectric ceramic drivers may also be used if suitably insulated from the water.

In operation the rods (20A–20D) of FIG. 2 on expansion, push against each other and cause a total outward expansion of the square configuration. Now, according to the resultant vector as shown on one apex at 25, the result is equivalent to the forces which could be generated by a rod set as in FIG. 1. In the case of FIG. 2 the four rods approximate a ring structure and expand outward as the rods expand with this outward expansion causing the curved plates (22A–22D) to also move outward and thus act as radiating pistons for the structure. In addition to this the plates are bent in their flextensional mode and consequently also move outward with a magnified motion from the rod extensions (at 24) producing a large total displacement. Because of the comparatively high compliance curved plates, they do not appreciably inhibit the motion of the rods. On contraction of the rods all parts will move inward, again resulting in a large total displacement.

Figure 2A:
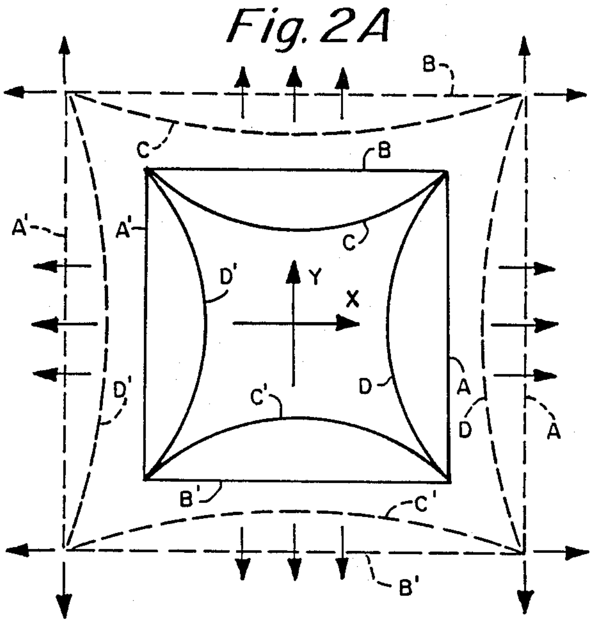
FIG. 2A is a schematic diagram illustrating the magnifying motion principals of the present invention as applied to a substantially square transducer.

A schematic outline representation of FIG. 2 is shown in FIG. 2A where the initial state is illustrated by the solid lines while the state one quarter cycle later is shown by the dashed lines. Here we see the (exaggerated) increased size of the rod geometry as it pulls the shell outward and, through the lengthwise extension of the rods, also causes the curved shell to undergo a flextensional motion resulting in outward amplified bending motion in the same direction that the shell is moving in translation. Thus, the shell undergoes both bending and translational motion in the same direction yieldinq greater displacements and greater acoustic output.

The mechanism for the additive motion may also be understood by considering pairs of driving rods and their additive affect on the motion of the shell segments. Thus, in FIG. 2A the expansion motion of rods A and A′ along the Y axis causes the shells C and C (as well as the rods B and B′) to move along the Y axis. Simultaneously with this motion the expansion of the rods B and B′ along the X axis cause the shells C and C′ to bend outward along the Y axis and add to the motion induced by the rods A and A′. The motion in the X direction may be explained by the same reasoning. Here the expansion of the rods B and B′ cause the shells D and D′ to move with translation along the X axis and the expansion of the rods A and A′ cause the same shells D and D′ to bend in the same direction along the X axis.

Figure 3:
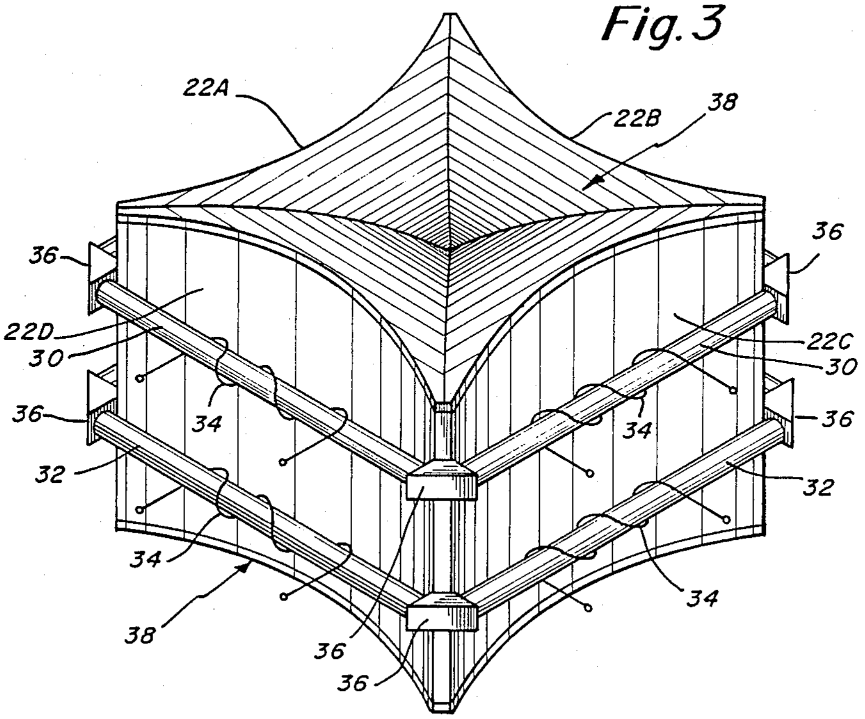
FIG. 3 is a perspective view illustrating an alternate transducer construction employing curved end plates and a double layered magnetostrictive driving system with magnetic couplers at their ends.

With reference to FIGS. 2 and 2A, in that particular structure the ends thereof may be shielded by means of an acoustically isolated thick and stiff metal plate at both ends of the structure. An alternative technique would be to use inwardly curved end plates attached directly to the apexes or possibly the radially curved plates as illustrated in FIG. 3. With this arrangement the end plates expand in phase with the radial motions producing additional acoustic output. Also illustrated in FIG. 3 is a double layered magnetostrictive driving system with magnetic couplers on their ends.

With more reference in particular to FIG. 3, it is noted that in this embodiment the construction is similar to that described in FIG. 2 employing shells 22A–22D. However, rather that using the four rods 20A–20D, there are double sets of rods such as the rods 30 in one set and the rods 32 in a lower set. Each of these rods is seperately and selectively excited by means of the coils 34 shown. FIG. 3 also shows magnetic couplers 36 at the corners of the apparatus. The magnetic couplers 36 connect together the rods to form a closed magnetic path either for each four rod set (as illustrated in FIG. 3) or for rod pairs with couplers at the corners extending from the top set to the bottom set of rods. FIG. 3 also shows the specific end construction referred to previously in the form of radially curved plates illustrated at 38.

Figure 4:
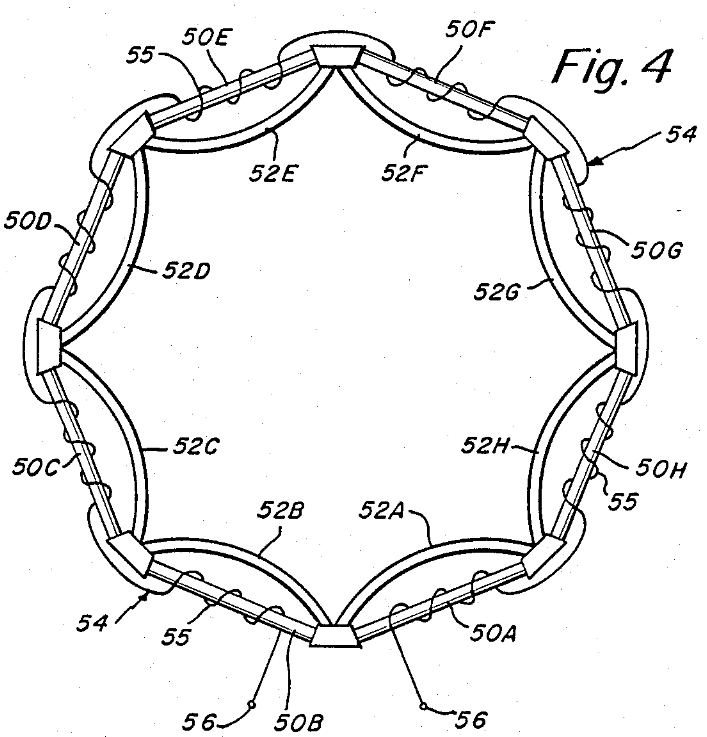
FIG. 4 illustrates an octagon shaped transducer employing magnetostrictive rods on the outside of curved shells with the rods being driven through a common drive circuit.

A more complex shape of the invention is shown in FIG. 4 where now the magnetostrictive rods (50A–50H) take on the shape of an octagon. In this latter case it is easily seen that under simultaneous expansion of the rods the polygon moves outwardly as a ring bringing along with it the curved plates (52A–52H) which move outward with both translation and bending motions. In this case the geometry of the driving system approximates a toroidal magnetic circuit if magnetostrictive elements are used.

In the embodiment of FIG. 4 it is noted that the excitation circuit 54 is in the form of a series of interconnected coils 55 each associated with one of the magnetostrictive rods. This circuit is excited at the terminals of 56.

Figure 5:
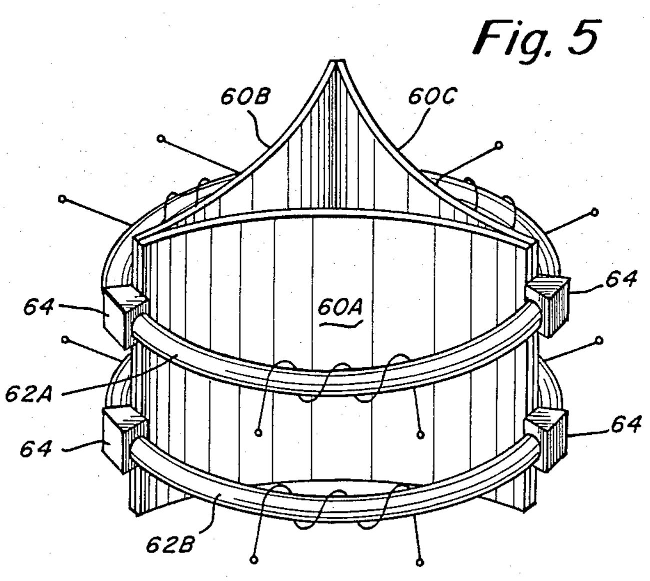
FIGS. 5 and 6 illustrate a further embodiment of the invention employing the minimum number of shells, namely three shells are driven by a pair of transducer rings.

An additional alternative to a polygon drive arrangement is to utilize a piezoelectric or magnetostrictive ring as the driving mechanism along with the various shell configurations illustrated. Thus in FIG. 4 the eight separate rods may be replaced by one or possibly two or more continuous piezoelectric or magnetostrictive rings firmly attached to the apexes and suitably electrically insulated from the water if used in underwater applications. The ring height must be short compared to the height of the curved structure so as not to block the radiation from the curved plates. FIG. 5 illustrates this drive mechanism for the case of a three sided structure driven by two rings.

Figure 6:
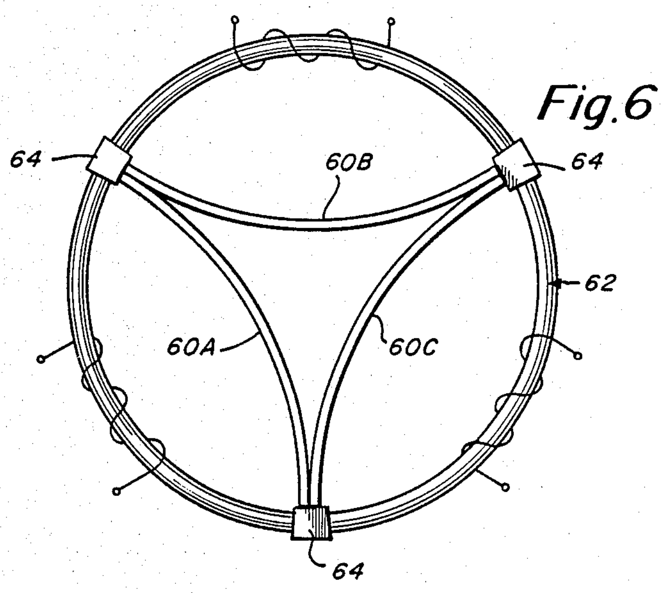

With particular reference to FIGS. 5 and 6, there is illustrated therein the minimum shell configuration employing three arched shells 60A–60C. Also illustrated is the continuous ring at 62 and illustrated in FIG. 5 as actually being formed from a pair of spaced rings 62A & 62B. As clearly illustrated in FIG. 6 each of these rings is attached at the apex of the shells illustrated at 64. Again, excitation is provided for the magnetostrictive rings.

Figure 7:
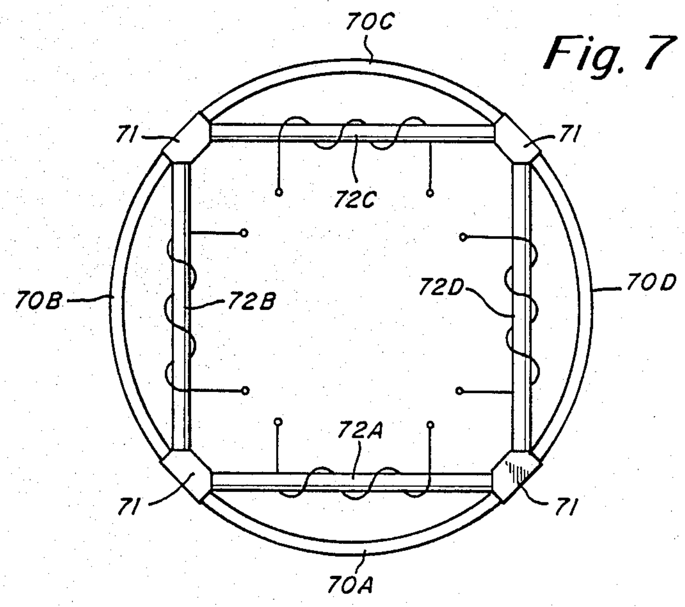
FIG. 7 schematically illustrates a further embodiment of the present invention employing four shells with associated magnetostrictive rods in which the shells are disposed externally of the rods.

FIG. 7 illustrates an alternate embodiment of the present invention that is also in the form of a square transducer. It is noted that in the embodiments of FIGS. 2–5 the magnetostrictive drive members are on the outside of the transducer structure. FIG. 7 illustrates an arrangement in which the magnetostrictive rods are disposed on the inside of the structure. In this regard note the four curved shells 70A–70D connecting at their apexes at 71 with the magnetostrictive rods 72A–72D. In this arrangement when the rods expand the shells likewise undergo both translational and bending motions as in the previous embodiments. However, here the bending and translation motion are not generally in the same direction and thus this configuration of FIG. 7 is not the preferred embodiment. In cases where the translation motion is small this arrangement may produce satisfactory output.

The design and operation of the transducer is affected by the proximity of the resonant frequency of the shell pieces as well as their combined resonance and the resonance of the polygon or ring driving elements. The resonant frequency of the curved shell pieces depends on the wall thickness of the curved shell pieces and the lengths of the major and minor axes. The resonant frequency of the polygon or ring driving system is most strongly dependent on the average diameter of the geometry. The two resonances may be operated toqether as a coupled system providing a smooth broadband response.

Typically the flextensional shell resonance is below the ring or polygon resonance. Here the ring motion augments the shell bending motion. On the other hand, if the shell resonance were above the ring resonance, its motion may be thought of as augmenting the motion of the ring. I closely coupled, their motions would augment each other.

The shell may be used to pre-stress the transduction drivers for high power operation by inserting the rods or bars in place while the shell is under outward radial expansion. Relaxation of the shell then puts the rods or bars into compression allowing greater strains without fracture.

The transducer may be operated in air or in water depending upon the design parameters chosen. It may also be operated in the receive as well as the transmit mode. The transducer may also be driven by a combination of magnetostrictive and piezoelectric drive elements to obtain directional or self tuned performance as described in my U.S. Pat. No. 4,443,731 "Hybrid Piezoelectric and Magnetostrictive Acoustic Wave Transducer" (Apr. 17, 1984).

Thus, in the embodiments described herein in FIGS. 1-7 the transducer is in the form of an acoustic transducer formed from a minimum of three curved shells which are attached to each other at their ends. The shells are driven by a transduction mechanism which is attached to the apexes of the shells. The shell is preferably curved inward so that as it moves outward in a radial direction the shell also bends outward in the radial direction yielding improved performance with the added displacement which is particularly important at low operating frequencies. The shell may be driven by a polygon or ring shaped transduction mechanism preferably surrounding and attached to the apexes of the shell. The shell may also be driven from within the shell by transducer bars or rods attached to the apexes of the curved shell. The inside of the shell may be shielded and only the outside radiation utilized or vice versa, or in combination. Electrostrictive (piezoelectric) and magnetostrictive transduction may be used to drive the shell. The resonances of the shell and the ring system may be brought close together to yield a broad band smooth response. The shell flextensional response may also be used to enhance the output of a ring type transducer.

Reference is now made to a number of additional embodiments of the invention described in FIGS. 8-18 herein. Included in these additional embodiments is an encapsulated version of the invention particular for underwater application and preferably employing a piezoelectric drive structure.

Previously, in FIG. 1 there has been illustrated an internal drive arrangement. FIGS. 2-6 have illustrated external drive arrangements. The additional embodiments of the invention predominantly describe further interior drive arrangements. For some applications the interior drive system is more advantageous particularly where it is desired to protect the piezoelectric material from exterior forces or fluids. In this regard in FIGS. 16 and 17 there is described herein a piezoelectric drive embodiment of the invention in which the top and bottom shell is capped by mechanically isolated end plates, all to be described in further detail hereinafter.

Figure 8:
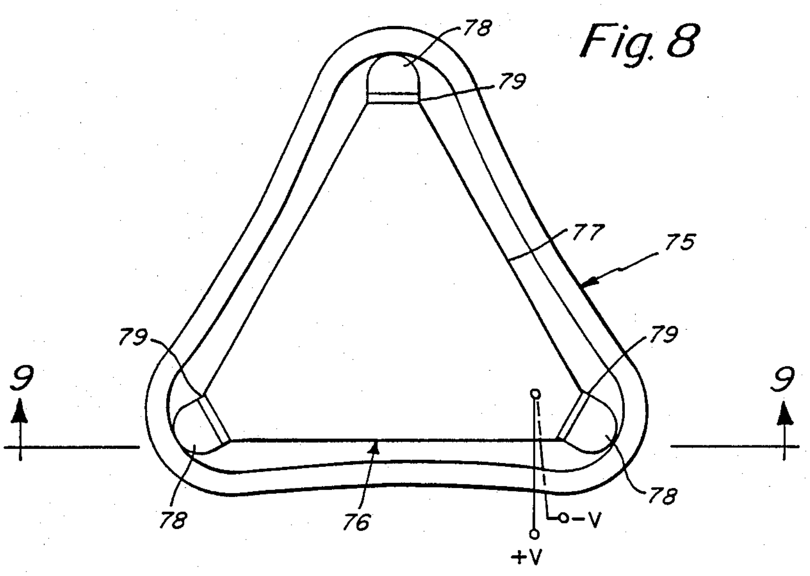
FIG. 8 illustrates a three-sided concave shell configuration driven by a planar mode piezoelectric triangular plate.
Figure 9:
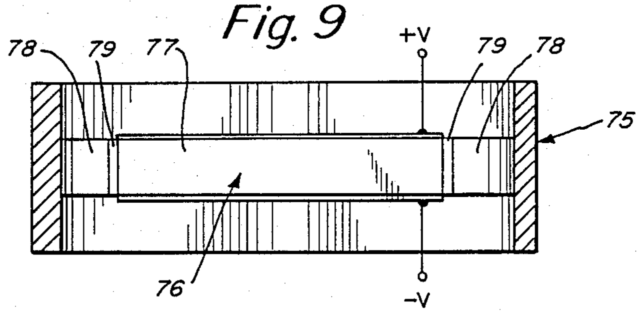
FIG. 9 is a cross-sectional view taken along line 9—9 of FIG. 8.

Reference is now made to FIGS. 8 and 9 for an illustration of a triangular-shaped transducer employing a triangular-shaped outer shell 75 driven from a substantially triangular shaped piezoelectric drive member 76. The piezoelectric drive member 76 is comprised of three piezoelectric sections 77 interconnected at the apexes of the triangular configuration by means of the metal shanks 78. The sections 77 are isolated from the metal The triangular shaped shell 75 may be constructed of a light weight metal such as aluminum. The top and bottom surfaces of the piezoelectric plate 76 are silvered and connected to electrical leads as illustrated, in particular, in FIG. 9.

In the embodiment illustrated in FIGS. 8 and 9 when a sinusoidal voltage is applied to the leads that are illustrated, the perimeter of the piezoelectric plate member 76 increases and decreases and accordingly causes the shell 75 to move by way of the mechanical connection made by the three stiff shanks 78. In other words, the shanks 78 are rigidly connected to the shell.

Figure 10:
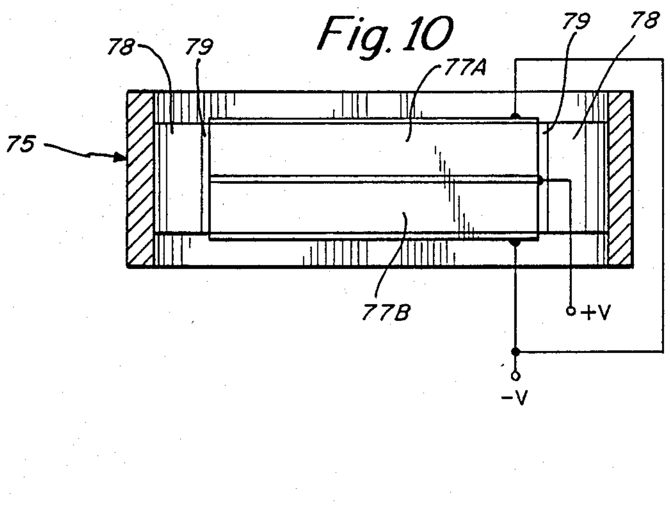
FIG. 10 is a cross-sectional view similar to that of FIG. 9 but for an alternate embodiment of the invention employing a pair of piezoelectric members.

Reference is now made to the cross-sectional view of FIG. 10 for an alternate embodiment of the invention. This alternate embodiment is primarily in the alternate drive means that is employed using two plates 77A and 77B connected both mechanically and electrically in parallel, as illustrated.

In the general construction illustrated in FIGS. 8-10, the top and bottom ends of the shell 75, such as in the cross sectional view of FIG. 9, can, in an alternate embodiment be capped to isolate the interior motion from the exterior medium. Alternatively, the interior can be electrically insulated and operated under a free-flooded condition. The shell 75 itself can be formed from one piece by extrusion or by reworking a circular ring or alternatively be constructed from three separate plates.

Reference is now made to FIGS. 11 and 12 for another embodiment of the present invention. The transducer in this embodiment is in the form of a four-sided asteroid. Both the shell and drive mechanism are of this general shape. There is a four-sided asteroid shell 80 driven from an interior piezoelectric bar member 82. The piezoelectric bar member 82 is comprised of a series of intercoupled bars 81. In the embodiment illustrated in FIGS. 11 and 12 the bars 81 are connected in parallel and operated in a 33 mode for maximum coupling. At the corners of the asteroid shaped transducer there are provide metal shanks 83 each having associated therewith an electrical insulator 84. This provides the intercoupling support from the piezoelectric member to the shell.

When a sinusoidal signal is applied to the voltage terminals illustrated in FIG. 11, the bars 81 expand and contract and move the shell accordingly by means of the connecting stiff metal shanks. In this connection, if the shanks 83 are made of a non-metallic material, then additional wiring may be used to complete the wiring connected to the negative terminal.

Figure 13:
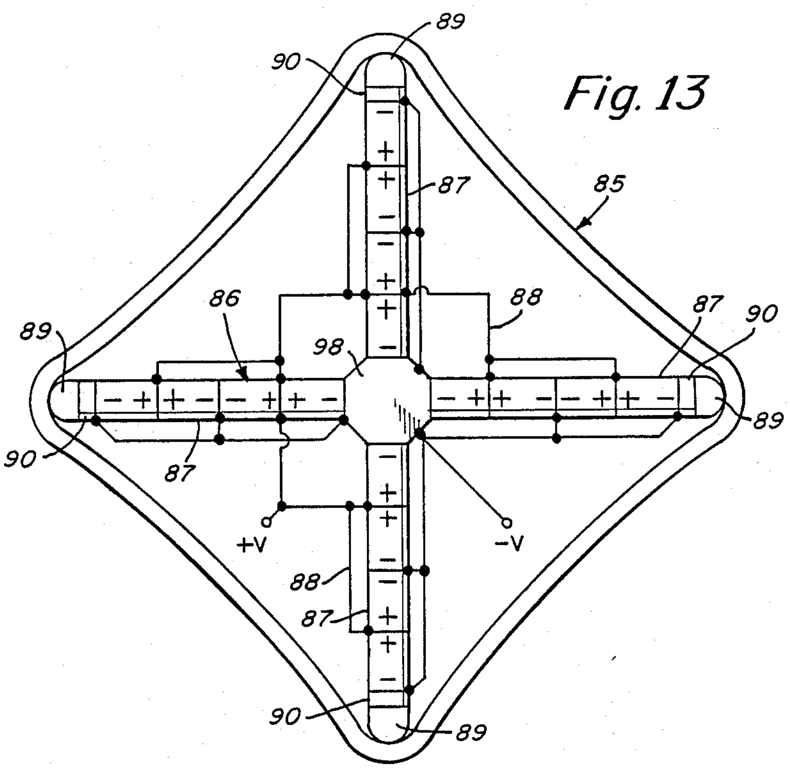
FIG. 13 illustrates a four-sided asteroid shell in combination with a cross shaped piezoelectric drive.

Reference is now made to FIG. 13. In this embodiment of the invention the shell is of asteroid shape and the piezoelectric driver is of cross-shape. Thus, in FIG. 13 there is illustrated the four-sided asteroid shell 85 and associated piezoelectric bar member 86. The bar member 86 may be considered as having a four separate arms with each arm comprised of four bars 87. FIG. 13 also shows the wiring interconnections at 88 regarding the proper wiring made to each of the bars 87. The voltage terminals are also illustrated in FIG. 13.

FIG. 13 also illustrates the metal support shanks 89 that intercouple by way of electrical insulator 90 from the end of each arm to a point of the four-sided asteroid shell. The insulators 90 are used at the extremeties of the piezoelectric arms or stacks to isolate the shell from the applied voltage.

Figure 14:
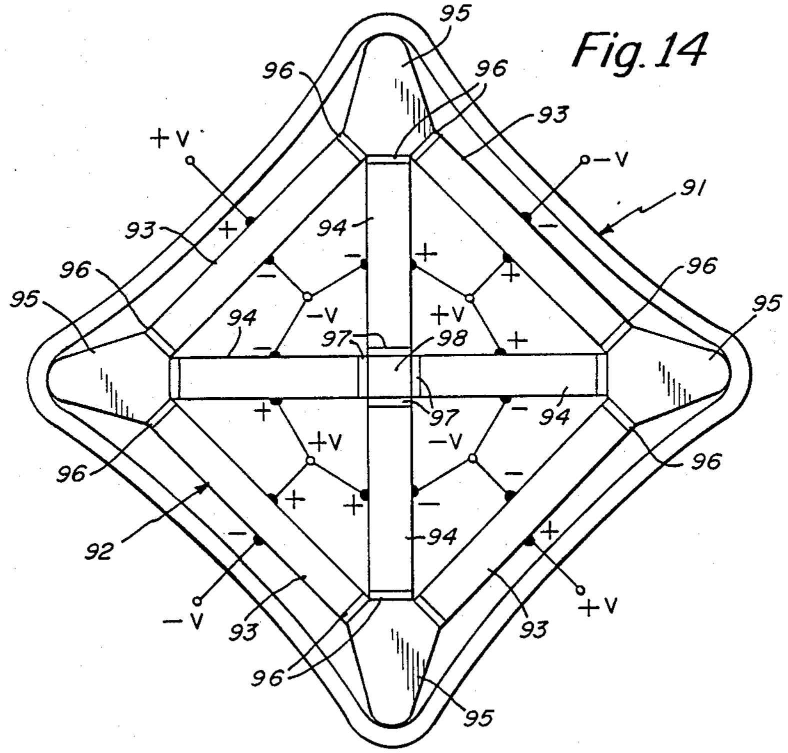
FIG. 14 illustrates a combination of drives as per FIGS. 11 and 13.

Reference is now made to FIG. 14 for a combination of the configurations of FIGS. 11 and 13. In particular, there is a combination of the two interior piezoelectric drive systems. Although a 33 mode may be employed, it is preferred that the piezoelectric bars be operated herein in this embodiment in a 31 mode. In this regard the negative terminals are all connected together and all positive are also connected together, as illustrated. This particular structure is stronger than the ones illustrated in FIGS. 11 and 13 and produces more mechanical force.

In the particular embodiment of FIG. 14 there is illustrated four-sided asteroid shell 91 and associated internal piezoelectric drive member 92. The drive member 92 is comprised of a peripheral set of bars or plates 93 and a cross-shaped set of bars or plates 94. FIG. 14 also illustrates the support shanks 95 and associated electrical insulators. There are insulators 96 at each of the shanks 95 and there are also a series of insulators 97 at the very central area where the piezoelectric bars 94 commonly interconnect. This is at the center post 98 which may also be made of a metallic material. In this connection FIG. 13 also shows a center post 98 which may be an insulator in that particular embodiment.

Figure 15:
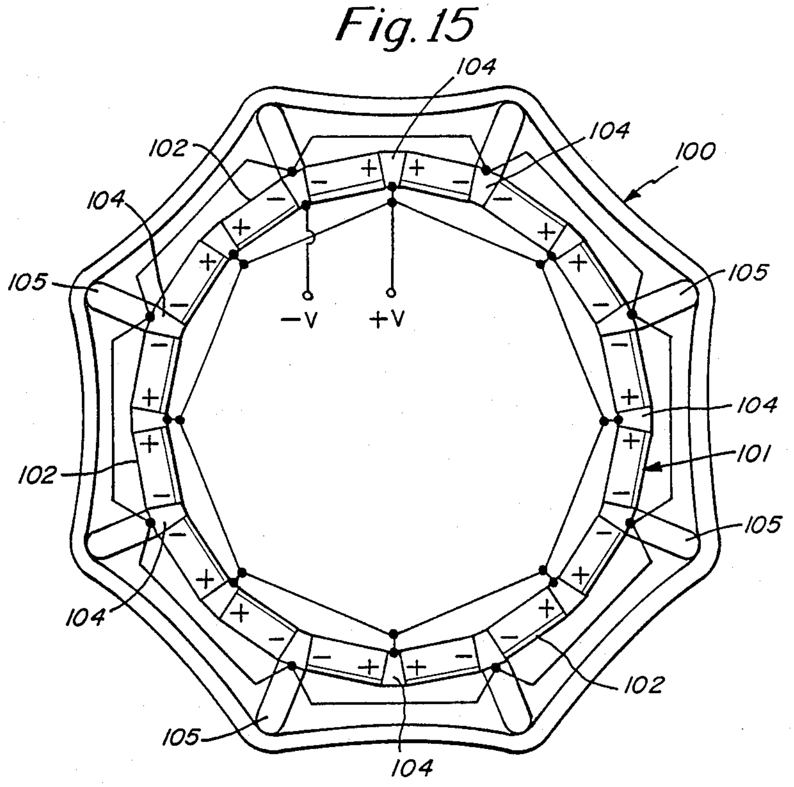
FIG. 15 illustrates an eight-sided shell construction driven from an interior piezoelectric ring.

Previously, in FIG. 4 there has been illustrated an external drive system for use with a many sided shell. FIG. 15 now illustrates the dual of that in which the shell is comprised of a plurality of concave curvatures. In particular, in FIG. 15 there is illustrated an eight-sided configuration driven from an interior piezoelectric ring. Thus, in FIG. 15 there is illustrated an eight-sided shell 100 and inside thereof, an interior piezoelectric ring 101. The ring 101 is comprised of a plurality of piezoelectric bars 102. The piezoelectric ring is operated in the 33 mode for maximum output. In this particular illustration of FIG. 15, the shell has eight concave curves and the piezoelectric drive employs sixteen bars and sixteen associated conductive wedges 104. These combinations of bars and wedges form a ring for providing a radial driver for the shell 100. The mechanical connection to the shell is through the eight stiff shanks 105 disposed at the wedges, as illustrated.

FIGS. 8–15 herein have illustrated the use of a piezoelectric driver. In accordance with further embodiments of the invention, not specifically illustrated herein, the driver may be a magnetostrictive drive system. However, in the case of magnetostriction the electrical energy is developed from a coil of wire and the electrical impedance is usually very low so that the system is driven from a low voltage source. There is thus little concern with the need for electrical isolation and the unit may be imersed in water with the only insulation required being at the point of the connections of electrical leads.

Now, in the case of a piezoelectric driver it has been found that substantial electrical insulation is desired, particularly for embodiments of the present invention adapted for application in underwater acoustics. In a piezoelectric drive system the impedance is comparatively higher than in the case of magnetostriction and thus higher voltages are employed. In the piezoelectric version there are relatively large exposed conducting surfaces. Thus, effective electrical insulation is desired particularly if a piezoelectric drive system is used in underwater applications.

For under water applications it has been found desirable to provide the piezoelectric drive arrangement, and in particular an internal drive arrangement so that the piezoelectric drive structure is not exposed to the water. The piezoelectric driver is advantageous because the piezoelectric material is more readily available and of lower cost than magnetostrictive material and in particular the rare earth magnetostrictive materials referred to herein. Also, even though the magnetostrictive driver is of lower impedance, it requires higher drive currents for a given power input, than the piezoelectric driver and thus their is greater heat generation by the magnetostrictive driver. In underwater applications as illustrated hereinafter, the transducer is sealed and thus it has been found desirable to use a lower dissipation driver which, for the under water application, is a piezoelectric driver. In connection with the magnetostrictive driver there is greater heat dissipation because of the need for a coil that provides attendant ohmic loss by virtue of the relatively substantial current flowing in the coil. Thus, the magnetostrictive driver tends to be less efficient than the piezoelectric driver.

As indicated previously, for under water applications the transducer is sealed, as will be described in further detail hereinafter, and thus heat dissipation becomes an important factor. Again, the piezoelectric driver, for a given power input dissipates less heat than a corresponding magnetostrictive driver. Also, the piezoelectric structures lend themselves more readily to varied forms and configurations.

Figure 16:
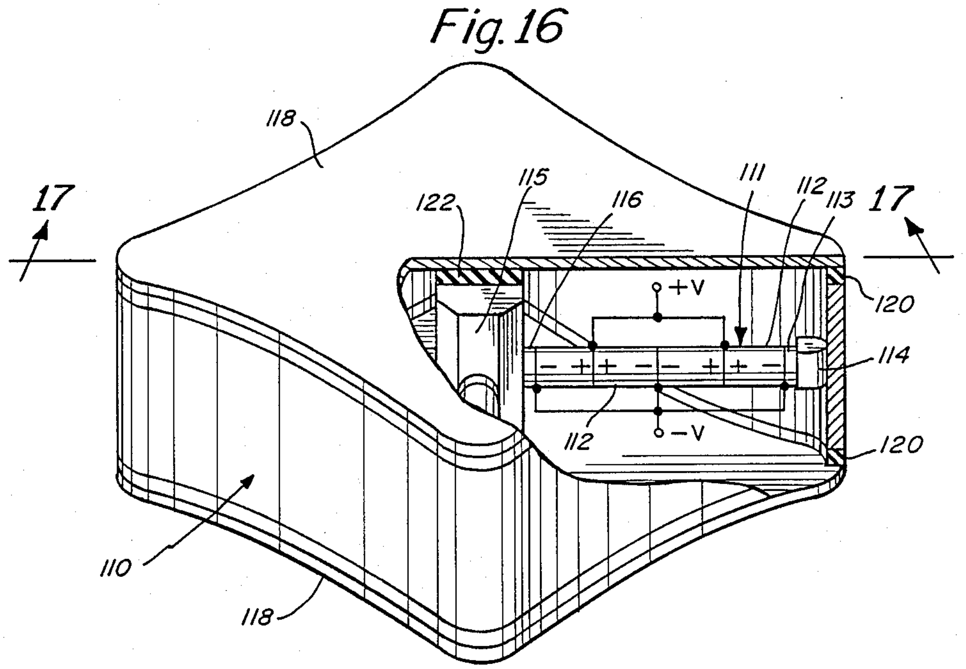
FIG. 16 is a perspective view partially cut away, illustrating a four-sided asteroid shell of configuration similar to that described in FIG. 13 but with the transducer enclosed for underwater application.
Figure 17:
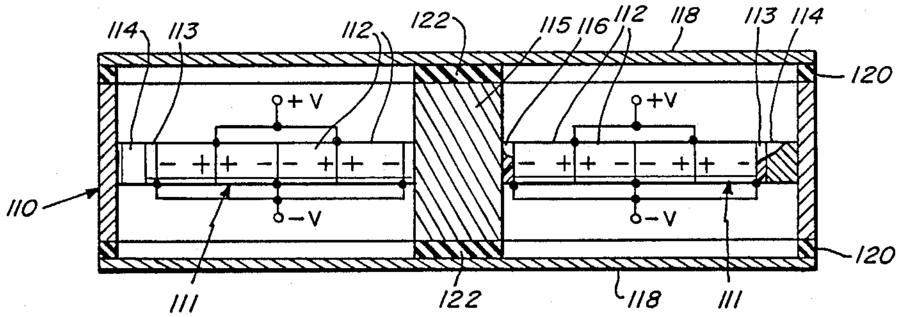
FIG. 17 is a cross-sectional view taken along line 17—17 of FIG. 16.

The basic arrangement illustrated in FIGS. 16 and 17 is substantially the same as the configuration of FIG. 13 previously described. There is thus described a four-sided asteroid shaped shell 110 having on the interior thereof a piezoelectric drive member 111 that is of cross-shape having four arms with each arm comprised of four piezoelectric bars or rods 112. At the end of each of these arms or stacks there is an electrical insulator 113 coupling to the metallic support shank 114. In this embodiment of the invention the four piezoelectric arms are commonly supported at the center support post 115. Insulators 116 are also provided between the piezoelectric bars and the support post 115.

Figure 18:
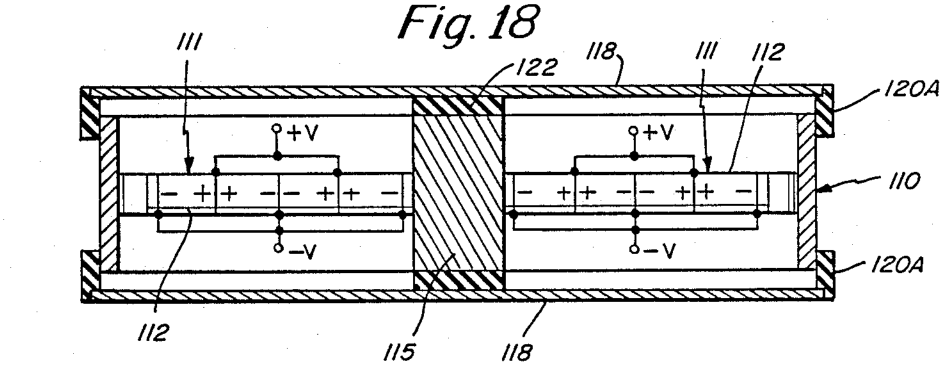
FIG. 18 is a cross-sectional view similar to that illustrated in FIG. 17 but showing an alternate seal means.

The shell 110 is closed at its top and bottom by end plates 118. These end plates are sealed with the shell by means of the peripheral seals 120. The end plates 118 are used to prevent the water from reaching the interior of the transducer and furthermore for preventing electrical shorting of the leads and conducting surfaces. The plates preferably conform to the outline of a particular transducer configuration as illustrated in FIGS. 16–18 for a four-sided device. For a multi-sided device such as the octogonal transducer of FIG. 15, a substantially circular end plate may be employed.

In addition to the seals 120 provided between the shell and the end plates, there are also seals 122 provided between the center support post 115 and the end plates 118. This is illustrated clearly in FIG. 17. The seals 120 and 122 are preferably of a rubber or the like flexible material that would provide a water-tight seal while at the same time permitting a free displacement of the shell as driven from the piezoelectric member. As indicated previously, there is also additional suspension at the center of the drive system by means of support at the center post 115. In this regard the center position is a position of no motion and an ideal position for mounting (supporting) the end plates. However, even here, rubber gaskets or a like rubber material are preferred to provide additional mechanical isolation, as illustrated in the cross-sectional view of FIG. 17. With this arrangement the end plates prevent the exterior fluid from filling the inside and shorting out the piezoelectric drive system, while at the same time not inhibiting the mechanical motion. Thus, in accordance with the present invention the sealing or gasketing is not only for maintaining liquid tightnes but is also provided for giving a certain amount of resilient support between the end plates and the shell so that there is no impeding of shell motion.

FIG. 18 is a cross-sectional view similar to that of FIG. 17 and showing a slightly different sealing arrangement. In this embodiment of the invention the sealing or gasketing between the shell and the end plates is carried out by means of peripheral seals 120A. These seals overlap the outer edge of the shell 110. It is also noted in this embodiment that there is a seal 122 at the center post for proper resilient support of the end plates 118.

In connection with the embodiment of the invention illustrated in FIGS. 16–18, such a transducer has been constructed and tested for low frequency operation. The transducer is in the shape of an asteroid formed by four curved concave metal plates driven at their junctions by four piezoelectric ceramic stacks configured in a cross-shape. As the stacks expand in the positive of cycle of operation, the four curved plates of the asteroid move outward in a motion that is the sum of the radial motion and the outward bending of the curved plates, yielding a cummulative acoustic output. The experimental model is approximately 25" in diameter and 6" high with four curved steel plates each 0.25" thick. The transducer operates in the frequency band of 500 to 1500 Hertz.

Figure 19:
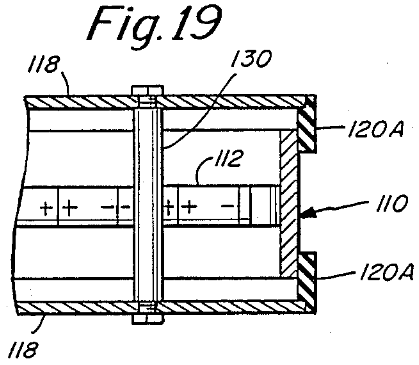

Reference is now made to the fragmentary view of FIG. 19 showing a different manner of support for the end plates 118. This embodiment of the invention employs preferably a plurality of rods or standoffs 130 only one of which is illustrated in the fragmentary view of FIG. 19. In the particular construction of FIGS. 16–18, it is noted that the driver is of cross shape. In such an embodiment the standoff's 130 may be employed between the separate piezoelectric drive members 111. Furthermore, there may be provided a centrally disposed standoff 130 for the most part in the position of the center post 115 illustrated in the previous embodiments. It is noted that the stiff rods or standoffs 130 each have a step at each end with the end plates supported by these devices. The end plates are preferably close to but not touching the moving parts of the transducer. These standoffs prevent the plates 118 from compressing the gasketting, particularly the gasket 122 illustrated in FIGS. 17 and 18. However, the standoffs are supported in a manner so that there is no impeding of the normal shell action. In deep under water applications the standoffs would be particularly advantageous in preventing severe compression of the seals used in the transducer.

Having now described a limited number of embodiments of the present invention, it should now be apparent those skilled in the art that numerous other embodiments and modifications thereof are contemplated as falling within the scope of the present invention as defined by the appended claims.

What is claimed is:

1. A flextensional transducer comprising, a hollow resilient closed housing including at least three inwardly curved shells each having opposite ends, a transduction drive means including at least three drive members each having opposite ends, means commonly securing ends of the drive members to ends of the curved shells at at least three connection points corresponding to said at least three shells and drive members, said means commonly securing including electrical insulation means for electrically isolating the drive members from said shells, said connection points defining therebetween a locus of polygon configuration, and means for exciting said transduction drive means to cause the curved shells to move additively with both translational and bending motions in the same direction to enhance acoustic output.

2. A flextensional transducer as set forth in claim 1 wherein the hollow resilient housing is comprised of four shells and the transduction drive means comprises four corresponding drive members arranged in a substantially square transducer construction.

3. A flextensional transducer as set forth in claim 1 wherein the hollow resilient housing comprises eight curved shells and the transduction drive means comprises eight drive members.

4. A flextensional transducer as set forth in claim 1 wherein the curved shells are disposed inside of the transduction drive means.

5. A flextensional transducer as set forth in claim 1 wherein the curved shells are disposed outside of the transduction drive means.

6. A flextensional transducer as set forth in claim 1 wherein said transduction drive means comprises a magnetostrictive ring.

7. A flextensional transducer as set forth in claim 1 wherein said transduction drive means comprises an electrostrictive ring.

8. A flextensional transducer as set forth in claim 1 including four curved shells all curved inwardly and wherein said transduction drive means comprises four corresponding drive members disposed in a cross-shaped configuration inside of the curved shells.

9. A flextensional transducer as set forth in claim 8 wherein each of the drive members comprises a piezoelectric bar.

10. A flextensional transducer as set forth in claim 9 wherein the piezoelectric bar is comprised of multiple piezoelectrical plates.

11. A flextensional transducer as set forth in claim 1 wherein there are included four curved shells and four corresponding drive members with the drive members disposed outside of the shells and each drive member connected at their ends to the end of a corresponding shell.

12. A flextensional transducer as set forth in claim 11 wherein said means for exciting includes a coil means for separately driving each of the drive members.

13. A flextensional transducer as set forth in claim 12 wherein each of the drive members is comprised of one of a magnetostrictive means and an electrostrictive means.

14. A flextensional transducer as set forth in claim 1 wherein the transduction drive means includes separate first and second transduction members, each including at least three drive members.

15. A flextensional transducer as set forth in claim 1 wherein said drive members each comprise one of a magnetostrictive means and electrostrictive means.

16. A flextensional transducer as set forth in claim 1 wherein said transduction drive means comprises one of a magnetostrictive ring and electrostrictive ring, said ring adapted to be secured to the connected ends of the curved shells.

17. A flextensional transducer as set forth in claim 1 wherein said closed housing has opposite open ends and means for closing said open ends to provide a fluid-tight housing.

18. A flextensional transducer as set forth in claim 17 wherein said means for closing the open ends includes a pair of end plates.

19. A flextensional transducer as set forth in claim 18 including a sealing means disposed between the end plates and the housing.

20. A flextensional transducer as set forth in claim 19 wherein said sealing means is resilient to provide said fluid-tight housing while at the same time permitting unimpeded shell motion.

21. A flextensional transducer as set forth in claim 20 wherein the housing comprises four curved shells disposed in an asteriod configuration and said transduction drive means includes four separate drive members interconnected at a common center support post.

22. A flextensional transducer as set forth in claim 21 including a second sealing means for sealing between the center post and end plates.

23. A flextensional transducer as set forth in claim 22 wherein the pair of end plates in substance match the configuration of the shells of the housing.

24. A flextensional transducer as set forth in claim 1 wherein said means commonly securing further includes a securing shank at each connection point.

25. A flextensional transducer as set forth in claim 24 wherein the electrical insulation means includes an electrical insulator disposed between the shank and drive member.

26. A flextensional transducer comprising, a hollow resilient closed housing including at least three inwardly curved shells having opposite ends, a transduction drive means including at least three drive members each having opposite ends, means commonly securing ends of the drive members to ends of the curved shells at at least three connection points corresponding to said at least three shells and drive members, said connection points defining therebetween a locus of polygon configuration, means for exciting said transduction drive means to cause the curved shells to move additively with both translational and bending motions in the same direction to enhance acoustic output, and means at opposite open ends of said closed housing for closing the open ends to provide a fluid tight housing.

27. A flextensional transducer as set forth in claim 26 including sealing means disposed between the means for closing the housing and the housing shells.

28. A flextensional transducer as set forth in claim 27 wherein the sealing means includes a resilient seal for interconnecting the shells and means for closing and to provide fluid tightness while at the same time permitting substantially unimpeded shell motion.

29. A flextensional transducer as set forth in claim 28 wherein said means for closing includes a pair of end plates.

30. A flextensional transducer as set forth in claim 26 wherein said transduction drive means includes a piezoelectric driver comprised of multiple drive members for contacting said shell at said connection points, and electrical insulation means for electrically isolating the drive members from said shell.

31. A flextensional transducer as set forth in claim 30 wherein said piezoelectric drive means comprises a piezoelectric ring.

32. A flextensional transducer as set forth in claim 30 including standoff means for supporting said means for closing said housing.

33. A flextensional transducer as set forth in claim 32 wherein said means for closing includes a pair of end plates and said standoff means comprises a plurality of standoffs disposed between said end plates.

* * * * *